United States Patent
Fang

(10) Patent No.: US 12,248,023 B2
(45) Date of Patent: Mar. 11, 2025

(54) OUTPUT VOLTAGE COMPENSATION METHOD

(71) Applicant: Chih-Huan Fang, Taoyuan (TW)

(72) Inventor: Chih-Huan Fang, Taoyuan (TW)

(73) Assignee: Chroma ATE Inc., Taoyuan (TW)

( * ) Notice: Subject to any disclaimer, the term of this patent is extended or adjusted under 35 U.S.C. 154(b) by 149 days.

(21) Appl. No.: 18/088,792

(22) Filed: Dec. 27, 2022

(65) Prior Publication Data

US 2023/0251313 A1 Aug. 10, 2023

(30) Foreign Application Priority Data

Dec. 29, 2021 (TW) ................. 110149238

(51) Int. Cl.
*G01R 31/319* (2006.01)
*G01R 19/00* (2006.01)

(52) U.S. Cl.
CPC ... *G01R 31/31924* (2013.01); *G01R 19/0092* (2013.01)

(58) Field of Classification Search
USPC ................................................ 324/762.01
See application file for complete search history.

(56) References Cited

U.S. PATENT DOCUMENTS

2010/0026269 A1* 2/2010 Zhiang ............... H02M 3/156
  323/298
2020/0083803 A1* 3/2020 Smith ............... H02M 3/33507

* cited by examiner

*Primary Examiner* — Vincent Q Nguyen

(57) ABSTRACT

The present invention provides an output voltage compensation method, for a DC voltage source having a constant voltage circuit and a constant current circuit connected in series, and the DC voltage source provides an output voltage to a device under test (DUT), and the output voltage compensation method comprising: generating a voltage compensation value according to a load current and a gain parameter of the DUT; generating a virtual current setting value according to a voltage setting value and the voltage compensation value; generating a duty cycle command according to the virtual current setting value and a load current measurement value of the load current; and generating the output voltage conforming to the voltage setting value according to the duty cycle command. Wherein the gain parameter is related to a multiplier parameter of the constant voltage circuit.

5 Claims, 3 Drawing Sheets

OUTPUT VOLTAGE COMPENSATION METHOD

BACKGROUND OF THE INVENTION

Cross Reference to Related Application

The present application claims priority to Taiwan patent application Serial No. 110149238 filed on Dec. 29, 2021 the entire content of which is incorporated by reference to this application.

1. Field of the Invention

The present invention pertains to a method for compensating output voltage, more specifically to a method for compensating output voltage applied to a DC voltage source.

2. Description of the Prior Art

Generally speaking, if a constant voltage circuit and a constant current circuit would like to be installed in a DC voltage source at the same time, it can be connected the constant voltage circuit in series with the constant current circuit, or connected the constant current circuit in series with the constant voltage circuit. For safety considerations, when designing such DC voltage source, the constant voltage circuit will be connected in series to the constant current circuit, and the output voltage will be provided through the constant current circuit. The reason is that when the DC voltage source is switched between different modes, for example, switch from the constant current (CC) mode to the constant voltage (CV) mode, it is easy to cause a current surge making the current at the output terminal too large instantaneously, which may not only cause damage to the device under test (DUT), but also cause safety issue. Accordingly, using the constant current circuit to control the current at the output terminal can be helpful to limit the current.

However, under the framework of the constant voltage circuit connected in series to the constant current circuit, when the DUT draws current from the DC voltage source, it is found that the output voltage of the DC voltage source is not stable. For example, the current drawn by the DUT may be the cause of the instability of the output voltage of the DC voltage source. Accordingly, the industry needs an output voltage compensation method capable of operating the DC voltage source which has the constant voltage circuit and the constant current circuit connected in series, so as to solve the problem of unstable output voltage of the DC voltage source.

SUMMARY OF THE INVENTION

The present invention provides an output voltage compensation method, which can generate a voltage compensation value to compensate the output voltage according to the current drawn by the DUT, so that the output voltage after compensation can meet the preset voltage setting value.

The present invention provides an output voltage compensation method, for a DC voltage source having a constant voltage circuit and a constant current circuit connected in series, and the DC voltage source provides an output voltage to a device under test (DUT), and the output voltage compensation method comprising: generating a voltage compensation value according to a load current and a gain parameter of the DUT; generating a virtual current setting value according to a voltage setting value and the voltage compensation value; generating a duty cycle command according to the virtual current setting value and a load current measurement value of the load current; and generating the output voltage conforming to the voltage setting value according to the duty cycle command. Wherein the gain parameter is related to a multiplier parameter of the constant voltage circuit.

In some embodiments, the gain parameter is further related to a line impedance between the DC voltage source and the DUT. Besides, the step of generating the virtual current setting value according to the voltage setting value and the voltage compensation value further comprises: comparing a voltage modifying value with an output voltage measurement value of the output voltage to obtain a voltage error value; and converting, by a constant voltage compensator, the voltage error value to obtain the virtual current setting value; wherein the voltage modifying value is the sum of the voltage setting value and the voltage compensation value. Moreover, the step of generating the duty cycle command according to the virtual current setting value and the load current measurement value of the load current further comprises: comparing the virtual current setting value with the load current measurement value to obtain a current error value; and converting, by a constant current compensator, the current error value to obtain the duty cycle command. In addition, the output voltage compensation method further comprising generating the output voltage conforming to the voltage setting value by converting the duty cycle command through pulse width modulation.

In summary, the output voltage compensation method of the present invention can generate a voltage compensation value to compensate the output voltage according to the load current, so that the output voltage after compensation can meet the preset voltage setting value. In addition, the output voltage compensation method can also compensate the line impedance between the DC voltage source and the DUT, so that the DC voltage source applying the present invention can make the DUT receive a compensated and stable voltage.

BRIEF DESCRIPTION OF THE APPTERMINALED DRAWINGS

DETAILED DESCRIPTION OF THE INVENTION

The features, targetions, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1:
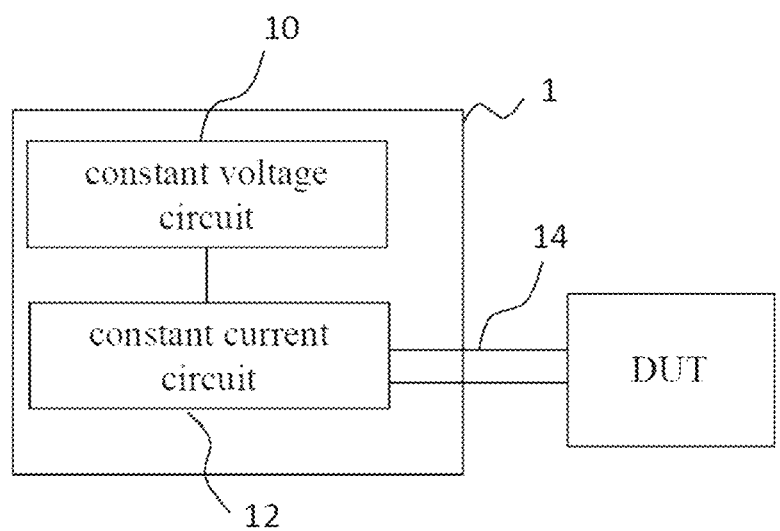
FIG. 1 illustrates a block diagram of a DC voltage source according to an embodiment of the present invention.
Figure 2:
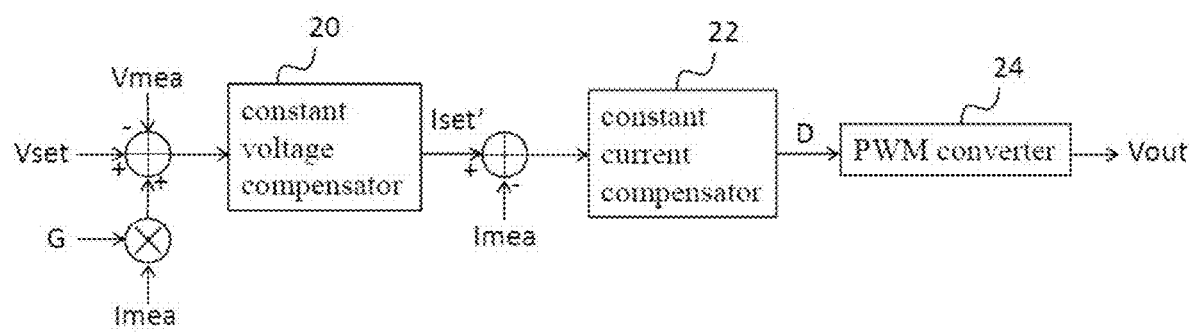
FIG. 2 illustrates a schematic diagram of calculating an output voltage by the output voltage compensation method according to an embodiment of the present invention.

Please refer to FIG. 1 and FIG. 2 together, FIG. 1 illustrates a block diagram of a DC voltage source according to an embodiment of the present invention, and FIG. 2 illustrates a schematic diagram of calculating an output voltage by the output voltage compensation method according to an embodiment of the present invention. As shown in the figures, the output voltage compensation method of the present invention can be applied to a DC voltage source 1, and the DC voltage source 1 has a constant voltage circuit 10 and a constant current circuit 12 connected in series. The constant current circuit 12 can be an output terminal of the DC voltage source 1 and can be electrically connected to the device under test (DUT) via a connection line 14. In one example, the DUT can be regarded as a load, which can consume the electric energy output by the DC voltage source 1. In practice, when the DUT is working, the DUT will draw current from the DC voltage source 1. Generally speaking, when the DUT is set to draw current from the DC voltage source 1, an output voltage Vout output by the DC voltage source 1 may drop slightly. The output voltage compensation method of the present embodiment is to compensate the output voltage Vout provided by the DC voltage source 1 to solve the problem of voltage drop.

In one example, the DC voltage source 1 is to provide a preset output voltage to the DUT, and the value of the preset output voltage is called a voltage setting value Vset in this embodiment. However, because the DC voltage source 1 is not ideal, the value of the output voltage Vout measured at the output terminal of the DC voltage source 1 may not be equal to the voltage setting value Vset. In this embodiment, the value of the output voltage Vout measured at the output terminal is called an output voltage measurement value Vmea, and the voltage setting value Vset is usually greater than or equal to the output voltage measurement value Vmea. In order to compensate the problem that the voltage setting value Vset is not equal to the output voltage measurement value Vmea, this embodiment adds a voltage compensation value to the voltage setting value Vset, so that the corrected voltage setting value can make the value of the output voltage Vout measured at the output terminal is equal to the voltage setting value Vset.

The present embodiment provides a method for calculating the corrected voltage setting value. As shown in FIG. 2, assuming that there is a voltage error value between the voltage setting value Vset and the output voltage measurement value Vmea, the voltage error value can be converted into a virtual current setting value by feeding into a constant voltage compensator 20 (a constant voltage circuit). For the convenience of description, the present embodiment expresses mathematical formula (1) as follows with the operation in the frequency domain:

$$(V\text{set}(s) - V\text{mea}(s)) \times CV = I\text{set}'(s) \tag{1}$$

In the above mathematical formula (1), Vset (s) represents the voltage setting value Vset in the frequency domain, Vmea (s) represents the output voltage measurement value Vmea in the frequency domain, and CV represents the conversion of the constant voltage compensator 20. The constant voltage compensator 20 corresponds to the aforementioned constant voltage circuit 10. Iset'(s) represents the virtual current setting value in the frequency domain. The constant voltage compensator 20 can be a transfer function applied to the constant voltage circuit 10, such as a digital control means for converting voltage into current. Different from setting the current setting value (Iset) directly, the current setting value converted by the constant voltage compensator 20 in the frequency domain is expressed as a virtual current setting value Iset'(s) in this embodiment. In one example, the voltage error value is the difference between the voltage setting value Vset(s) and the output voltage measurement value Vmea(s) shown in the mathematical formula (1). One of the functions of the aforementioned voltage compensation value is to compensate the voltage error value.

Subsequently, in this embodiment, the virtual current setting value is compared with a load current measurement value to obtain a current error value. Then the constant current compensator 22 converts the current error value to obtain a duty cycle command. The present embodiment expresses mathematical formula (2) as follows with the operation in the frequency domain:

$$(I\text{set}'(s) - I\text{mea}(s)) \times CC = D \tag{2}$$

In the above mathematical formula (2), Imea(s) represents the load current measurement value Imea in the frequency domain. The load current measurement value Imea is related to the load current of the DUT, which is obtained by measuring the real-time load current. CC represents the conversion means of the constant current compensator 22, and the constant current compensator 22 corresponds to the aforementioned constant current circuit 12. Similarly, the constant current compensator 22 is also a transfer function applied to the constant current circuit 12, such as a digital control means for converting the current into a duty cycle command D for pulse width modulation (PWM). Next, the duty cycle command D can be converted into an output voltage Vout having an output voltage measurement value Vmea(s), expressed in the mathematical formula (3) as follows:

$$D \times F = V\text{mea}(s) \tag{3}$$

Where F is a preset input voltage parameter of a PWM converter 24, and after the duty cycle command D is fed into the PWM converter 24, an output voltage measurement value Vmea(s) can be generated. In order to determine how to compensate the voltage error value, the present embodiment substitutes the mathematical formula (1) and the mathematical formula (2) into the mathematical formula (3), expressing the mathematical formula (4) as follows:

$$(((V\text{set}(s) - V\text{mea}(s)) \times CV) - I\text{mea}(s)) \times CC \times F = V\text{mea}(s) \tag{4}$$

The expression of the output voltage measurement value Vmea(s) is sorted out by the mathematical formula (4), and the mathematical formula (5) can be obtained:

$$V\text{mea}(s) = ((V\text{set}(s) \times CV) - I\text{mea}(s)) \times CC \times F/(1 + CV \times CC \times F) \tag{5}$$

According to the Final Value Theorem (FVT), when the domain t is infinite, the time-frequency domain s is zero, and (CV×CC×F) is, in general, far greater than 1. Thus, the mathematical formula (6) and the mathematical formula (7) can be obtained from the mathematical formula (5) as follows:

$$V\text{mea}(s) = ((V\text{set}(s) \times CV) - I\text{mea}(s))/CV \tag{6}$$

$$V\text{mea}(s) = V\text{set}(s) - I\text{mea}(s)/CV \tag{7}$$

CV can expressed in mathematical formula (8). When s is zero, CV can be expressed as a multiplying factor K and the mathematical formula (9) can be obtained from the mathematical formula (7) and (8):

$$CV = K(s/\omega z + 1)/(s/\omega p + 1) \tag{8}$$

$$V\text{mea} = V\text{set} - I\text{mea}/K \tag{9}$$

In practice, the multiplier parameter K related to the constant voltage compensator 20 is known. Besides, the gain parameter G is the reciprocal of the multiplier parameter K, and then the mathematical formula (9) can be expressed as a mathematical formula (10):

$$V\text{mea}=V\text{set}-I\text{mea}\times G \qquad (10)$$

In this embodiment, after the above calculation, it shows from the mathematical formula (10) that the difference between the voltage setting value Vset and the output voltage measurement value Vmea is Imea×G. That is to say, assuming that this embodiment compensates Imea×G to the voltage setting value Vset, the new voltage setting value Vset' is equal to the sum of Imea×G and the voltage setting value Vset, which means that the voltage setting value Vset in the mathematical formula (10) is substituted by the voltage setting value Vset' in the mathematical formula (11). Then when the DC voltage source 1 is set to the voltage setting value Vset', the output voltage measured value Vmea should be consistent with the voltage setting value Vset. Here, the new voltage setting value Vset' can be expressed as mathematical formula (11), and after being substituted into mathematical formula (10), the output voltage measurement value Vmea can be expressed as mathematical formula (12):

$$V\text{set}'=V\text{set}+I\text{mea}\times G \qquad (11)$$

$$V\text{mea}=(V\text{set}+I\text{mea}\times G)-I\text{mea}\times G=V\text{set} \qquad (12)$$

Based on the above, the present embodiment can calculate that the voltage compensation value is related to the load current (the measured load current value Imea) and the gain parameter G of the DUT. The unit of the gain parameter G is ohm (V/A). Since the multiplier parameter K is known, the gain parameter G as reciprocal of the multiplier parameter K should also be known. This embodiment demonstrates the method of compensating the voltage setting value Vset according to various load current measurement values Imea and the known gain parameters G, and the compensated voltage setting value Vset' can make the output voltage of the DC voltage source 1 conform to the voltage setting value Vset. However, in FIG. 1, the connecting line 14 is actually a non-ideal element, the output voltage Vout received by the DUT may also have difference after passing through the connecting line 14. In order to solve the above problems, this embodiment demonstrates that the output voltage Vout received by the DUT can be compensated by further adjusting the gain parameter G.

For example, the line impedance of the connection line 14 can be measured in advance, assuming it is 40 mΩ. In addition, assuming that the multiplier parameter K of the voltage compensator 20 is set to 80, the gain parameter G is the reciprocal (1/80) of the multiplier parameter K, that is, 12.5 mΩ. If the gain parameter G is substituted with 12.5 m according to the mathematical formula (11), it means that the compensated voltage setting value Vset' can make the output voltage Vout of the DC voltage source 1 conform to the voltage setting value Vset. However, if the gain parameter G is substituted with 52.5 m (12.5 m+40 m), it means that the compensated voltage setting value Vset' can make the output voltage Vout received by the DUT comply with the voltage setting value Vset. In this way, this embodiment implements an output voltage compensation method in which the compensation position can be set arbitrarily. If the compensation is only at the output terminal of the DC voltage source 1, the line impedance of the connecting line 14 does not need to be considered. And if it is to be compensated at the receiving terminal of the DUT, then the line impedance of the connecting line 14 can be compensated together into the gain parameter G.

Figure 3:
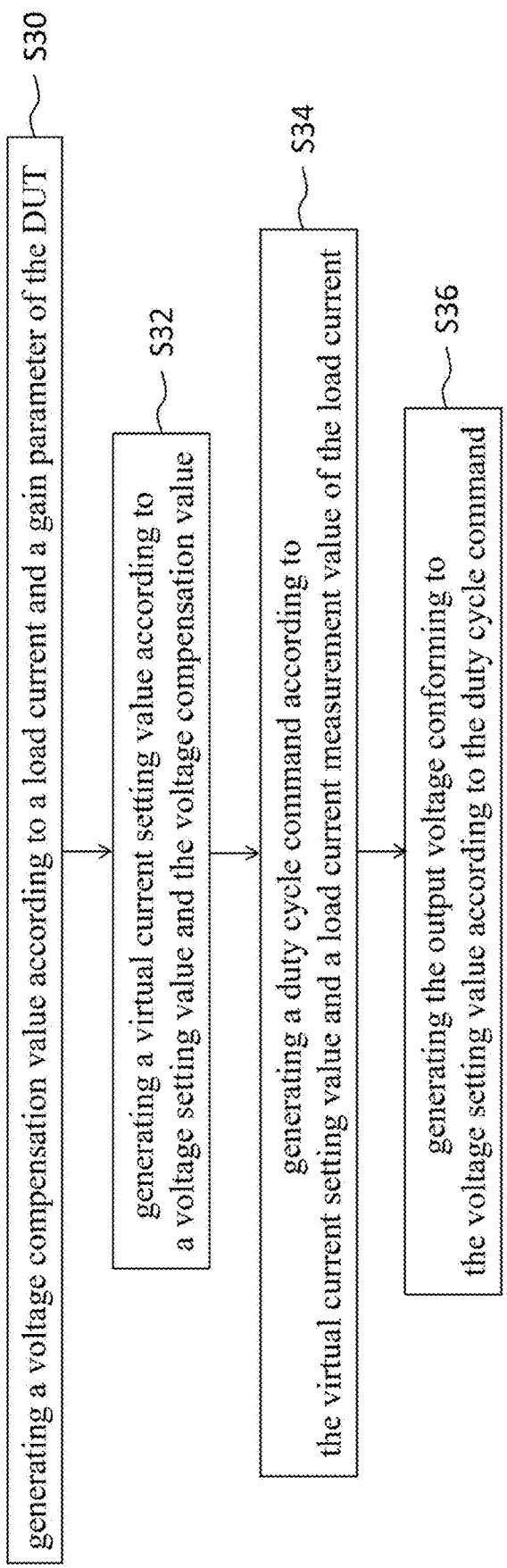
FIG. 3 illustrates a flowchart of the output voltage compensation method according to an embodiment of the present invention.

In order to illustrate the output voltage compensation method of the present invention again, please refer to FIG. 1 to FIG. 3 together. FIG. 3 illustrates a flowchart of the output voltage compensation method according to an embodiment of the present invention. As shown in the figures, in step S30, a voltage compensation value is generated according to the load current of the DUT and the gain parameter G, and the voltage compensation value can be (Imea×G) shown in the mathematical formula (11). In step S32, a virtual current setting value is generated according to the voltage setting value Vset and the voltage compensation value (Imea×G). As shown in the mathematical formula (11), the compensated voltage setting value Vset' is the sum of the voltage setting value Vset and the voltage compensation value (Imea×G), and then the compensated voltage setting value Vset' is converted into the frequency domain and substituted into the mathematical formula (1) for calculating the corresponding virtual current setting value Iset'(s). In step S34, a duty cycle command D is generated according to the virtual current setting value Iset'(s) and the load current measurement value Imea of the load current. Next, in step S36, according to the duty cycle command D, the output voltage Vout conforming to the voltage setting value Vset is generated. It can be seen from the above that since the virtual current setting value Iset'(s) has already corresponded to the compensated voltage setting value Vset', the duty cycle command D and the output voltage Vout converted by pulse width modulation should have eliminated the voltage error value. Therefore, the output voltage compensation method makes the output voltage Vout meet the voltage setting value Vset.

To sum up, the output voltage compensation method of the present invention can generate a voltage compensation value to compensate the output voltage according to the load current, so that the output voltage after compensation can meet the preset voltage setting value. In addition, the output voltage compensation method can also compensate the line impedance between the DC voltage source and the DUT, so that the DC voltage source applying the present invention can make the DUT receive a compensated and stable voltage.

What is claimed is:

1. An output voltage compensation method, for a DC voltage source having a constant voltage circuit and a constant current circuit connected in series, and the DC voltage source provides an output voltage to a device under test (DUT), and the output voltage compensation method comprising:

generating a voltage compensation value by the constant voltage circuit according to a load current and a gain parameter of the DUT;

generating a virtual current setting value by the constant voltage circuit according to a voltage setting value and the voltage compensation value;

generating a duty cycle command by the constant current circuit according to the virtual current setting value and a load current measurement value of the load current; and generating the output voltage conforming to the voltage setting value by the constant current circuit according to the duty cycle command;

wherein the gain parameter is related to a multiplier parameter of the constant voltage circuit, wherein the constant current circuit provides the output voltage to the DUT.

2. The output voltage compensation method according to claim 1, wherein the gain parameter is further related to a line impedance between the DC voltage source and the DUT.

3. The output voltage compensation method according to claim 1, wherein the step of generating the virtual current setting value according to the voltage setting value and the voltage compensation value further comprises:

comparing a voltage modifying value with an output voltage measurement value of the output voltage by a measuring circuit to obtain a voltage error value; and converting, by a constant voltage compensator, the voltage error value to obtain the virtual current setting value;

wherein the voltage modifying value is the sum of the voltage setting value and the voltage compensation value, wherein the constant voltage compensator is applied to a voltage-current transfer function of the constant voltage circuit.

4. The output voltage compensation method according to claim 1, wherein the step of generating the duty cycle command according to the virtual current setting value and the load current measurement value of the load current further comprises:

comparing the virtual current setting value with the load current measurement value by a measuring circuit to obtain a current error value; and converting, by a constant current compensator, the current error value to obtain the duty cycle command, wherein the constant voltage compensator is applied to a voltage-current transfer function of the constant voltage circuit.

5. The output voltage compensation method according to claim 1, further comprising: generating the output voltage conforming to the voltage setting value by converting the duty cycle command through pulse width modulation.

* * * * *